United States Patent [19]

Takabatake et al.

[11] Patent Number: 5,463,340
[45] Date of Patent: Oct. 31, 1995

[54] PHASE CLOCKED LATCH HAVING BOTH PARALLEL AND SHUNT CONNECTED SWITCHES FOR TRANSMISSION GATES

[75] Inventors: Akihiko Takabatake; Shinichi Uramoto; Shinichi Nakagawa, all of Itami, Japan

[73] Assignee: Mitsubishi Denki Kabushiki Kaisha, Tokyo, Japan

[21] Appl. No.: 76,649

[22] Filed: Jun. 15, 1993

[30] Foreign Application Priority Data

Jun. 23, 1992 [JP] Japan .................. 4-164826

[51] Int. Cl.⁶ ............................................... H03K 3/356
[52] U.S. Cl. .................... 327/211; 327/201; 327/203; 377/79; 377/105; 377/117
[58] Field of Search ................... 307/272.2, 272.3, 307/279, 289, 443, 451, 269, 272.1; 377/117, 79, 55, 105, 61, 77, 78; 327/210, 201, 200, 202, 203, 211

[56] References Cited

U.S. PATENT DOCUMENTS

| | | | |
|---|---|---|---|
| 3,930,169 | 12/1975 | Kuhn, Jr. ............................ | 377/117 |
| 3,993,916 | 11/1976 | Copeland, III et al. ............ | 377/79 |
| 4,394,586 | 7/1983 | Morozumi .......................... | 377/105 |
| 4,495,628 | 1/1985 | Zasio ................................... | 377/117 |
| 4,843,254 | 6/1989 | Motegi et al. ...................... | 327/203 |
| 5,027,382 | 6/1991 | Hiroe et al. ........................ | 377/78 |
| 5,081,377 | 1/1992 | Freyman ............................. | 327/211 |
| 5,105,100 | 4/1992 | Yamada .............................. | 327/202 |
| 5,202,908 | 4/1993 | Hatada ................................ | 377/77 |
| 5,289,518 | 2/1994 | Nakao ................................. | 377/78 |

OTHER PUBLICATIONS

Principles of CMOS VLSI Design—A Systems Perspective. Neil H. E. Weste and Kamran Eshraghian. FIG. 5.50 (on p. 215).

Primary Examiner—John S. Heyman
Attorney, Agent, or Firm—Oblon, Spivak, McClelland, Maier & Neustadt

[57] ABSTRACT

A general object of the present invention is to provide a latch of which demand is small. In a half-latch 101, control signals T2 and T2C which vary at late timings are applied to a main unit for data input (update) operation while control signals T1 and T1C which vary at early timings are applied to a feedback unit for data retaining operation. The data input (update) operation is never started until the data retaining operation is completed. The data retaining operation is practiced by retaining two signals having a negative logic relation with each other in a loop made up with two inverters. A signal related to retension of data and a signal newly input never reside in the same signal line. Thus, collision of those signals is avoided, and consequently, through-current due to the collision of the signals can be reduced.

12 Claims, 10 Drawing Sheets

PHASE CLOCKED LATCH HAVING BOTH PARALLEL AND SHUNT CONNECTED SWITCHES FOR TRANSMISSION GATES

BACKGROUND OF THE INVENTION

1. Field of the Invention

The present invention relates to a semiconductor device, and more particularly, it relates to a latch.

2. Description of the Prior Art

FIG. 9 shows a schematic diagram of a configuration of a general shift register in a prior art embodiment. A shift register consists of plural latches 1000 connected in series. A unit latch 1000 consists of a pair of half-latches 100. A control signal generator 60 generates control signals T and TC based upon a clock signal CLK. The control signals T and TC have a negative logic relation with each other, and they are also supplied to every one of half-latches 100 connected in series. Each of half-latches 100 has control signal input ends I1, I2.

In general, the control signal generator 60 receives the clock signal CLK, and inverters 61 and 62 together produce the control signal T having a positive logic relation with the clock signal while the inverter 61 alone produces the control signal TC having a negative logic relation with the clock signal. A delay time caused by the inverter 62 is inserted between those control signals.

FIG. 10 shows an internal configuration of one of the half-latches 100. An input line 1 leads an input signal D applied to the half-latch 100 into a transmission gate 21. The transmission gate 21 is connected through a signal line 2 to an inverter 23, which inverts the input signal D to apply an output signal Q to an output line 3.

The output line 3 is connected to an inverter 24, which inverts the output signal Q and produce an output signal QC to apply it through a transmission gate 22 to the inverter 23.

The transmission gate 21 consists of an N channel transistor 21a and a P channel transistor 21b; the control signal input end I1 is connected to a gate of the transistor 21a while the control signal input end I2 is connected to a gate of the transistor 21b. Similarly, the transmission gate 22 consists of an N channel transistor 22a and a P channel transistor 22b; the control signal input end I2 is connected to a gate of the transistor 22a while the control signal input end I1 is connected to a gate of the transistor 22b.

The transmission gate 21 and the inverter 23 cooperate with each other to receive the input signal D and output the output signal Q, both of which function as a main unit en bloc. The transmission gate 22 and the inverter 24 cooperate with each other to retain the output signal Q, both of which function as a feedback unit en bloc.

FIG. 11 shows a timing chart for illustrating a circuit operation of the half-latch 100 shown at left side in FIG. 9. Receiving the clock signal CLK, the inverter 61 delays it by a period $(t_{12} - t_{11})$ to produce the control signal TC having a negative logic relation with the clock signal CLK, and the inverter 62 further delays the control signal TC by a period $(t_{13} - t_{12})$ to produce the control signal T having a positive logic relation with the clock signal CLK. A delay time $(t_{13} - t_{11})$ is inserted between the clock signal CLK and the eventual control signal T.

Operations of the transmission gates 21 and 22 based upon the control signals T and TC will be described in conjunction with operating periods of the transistors 21a, 21b, 22a and 22b. Part hatched in FIG. 11 represents that each transistor turns on.

The operation of the half-latch 100 shown in FIG. 10 can be divided into a data input (update) operation by the main unit and a data retaining operation by the feedback unit. For example, turning the transmission gate 21 on in the main unit causes the input signal D to be taken in, and turning the transmission gate 22 on in the feedback unit causes the output signal Q to be retained.

When the control signal T is in the High state and the control signal TC is in the Low state (for a period $t_{13}$ through t15), the transmission gate 21 turns on while the transmission gate 22 turns off. Thus, the input signal D input to the input line 1 is applied to the inverter 23 via the signal line 2, and the output signal Q obtained by practicing a logic inversion of the input signal D is applied to the output line 3.

On the other hand, when the control signal T is in the Low state and the control signal TC is in the High state (for a period $t_{16}$ through $t_{12}$), the transmission gate 22 turns on while the transmission gate 21 turns off. Thus, the inverters 23 and 24 together make a loop, and thus, the output signal Q is retained in safety in the output line 3 while the signal QC obtained by logically inverting the output signal Q is retained in safety in the signal line 2.

In this way, the data input (update) operation by the main unit and the data retaining operation by the feedback unit are repetitively practiced in the half-latch 100, and thereby the shift register shown in FIG. 9 updates its value successively.

However, each of the transmission gates 21 and 22 consists of a complementary conductive transistor pair connected in parallel, and since the control signals T and TC which control these transistors to turn them on or off vary with a delay time of $(t_{13} - t_{12})$ or $(t_{16} - t_{15})$ inserted between them, both of the transmission gates 21 and 22 turn on for such periods of time. This is proved in FIG. 11 where there are several overlappings of the hatched part for the same time periods.

Time $t_{15}$ through time $t_{16}$, the transistor 22a begins turning on while the transistor 21a stays in the ON-state. Thus, both the transmission gates 21 and 22 turn on for this time period, and accordingly, the input signal D and the signal QC are transmitted to the signal line 2. As shown in FIG. 9, however, the identical control signals T and TC are applied to each of the half-latches 100 connected in series, and hence, when one, of those half-latches 100 starts the data retaining operation in the feedback unit, that half-latch never receives a new signal (i.e., the output signal Q of the preceding one to that half-latch, or the input signal D to that half-latch) from the preceding half-latch. A logic inversion of the input signal D by the inverter 23 is already completed at a point of time $t_{15}$.

Thus, time $t_{15}$ through time $t_{16}$, even if both the transmission gates 21 and 22 open, the input signal D is safely applied to the input line 1, the signal QC having a positive logic relation with the input signal D is safely applied to the signal line 2, and the output signal Q having a negative logic relation with the input signal D is safely applied to the output line 3, respectively.

At time $t_{16}$, both the transistors 21a and 21b of which the transmission gate 21 is comprised turn off, and both the transistors 22a and 22b of which the transmission gate 22 is comprised turn on; and accordingly, the loop made up with the inverters 23 and 24 brings the half-latch 100 into a data retaining state.

At time $t_{12}$, however, the transistor 21b turns on to turn the transmission gate 21 on, and accordingly, the half-latch 100 is in a state of transition from the data retaining operation to the data input operation. However, since the transistor 22b has been still in the ON-state since time $t_{12}$ or earlier, the transmission gate 22 turns on until time $t_{13}$.

In this case, since the preceding one to that half-latch 100 also updates data, the output signal D newly input to the signal line 1 and the signal QC retained in the signal line 2 collide with each other time $t_{12}$ through time $t_{13}$ if those signals are different in logic from each other. Collision of such signals having different logic values causes a large through-current, which leads to the problem that a demand should be increased. Additionally, a demand of the inverter 23 to which a potential at the signal line 2 is input is also increased because slow rising and slow falling of signals are caused in the signal line 2 where signals collide with each other.

In such an ordinary latch operation based upon positive and negative clocks, signals collided with each other if data retained in inputting data and data newly input are different in logic from each other, because a delay time inserted between positive and negative clocks causes transistors in a main unit and a feedback unit to be simultaneously turning on. In the above-mentioned latch, the inverter 24 in the feedback unit, which is an auxiliary part for retaining data, makes through-current flow during a variation in a signal each time data in the latch varies, and consequently, an extra electric power is consumed.

SUMMARY OF THE INVENTION

According to the present invention, a semiconductor device comprises a unit latch circuit consists of a pair of half-latch circuits, and a control signal supplier processing a clock signal in first and second processing periods of time to produce and apply first and second control signals substantially identical in pulse width with the clock signal for applying the first and second control signals to each of the unit latch circuits, wherein the second processing period of time is equal to or longer than the first processing period of time, each of the pair of half-latch circuits includes (a) an input terminal and an output terminal, (b) a first switch connected to the input terminal for turning on or off in the control of the second control signal, (c) first signal transmitting means having an input end connected through the first switch to the input terminal and an output end connected to the output terminal, for practicing a logic inversion, and (d) second signal transmitting means having an input end connected to an output end of the first signal transmitting means and an output end connected to an input end of the first signal transmitting means, for, in accordance with the first control signal, outputting a feedback signal which is obtained by practicing a logic inversion to an output from the first signal transmitting means.

Preferably, the first signal transmitting means is substantially comprised of an inverter.

Yet preferably, the control signal supplier further produces and applies a third control signal, which has a negative logic relation with the first control signal, to the half-latch circuits, the second signal transmitting means including (d-1) a signal processing unit having an input end connected to the input end of the second signal transmitting means, and an output end for outputting the feedback signal, and (d-2) a second switch connected between the output end of the signal processing unit and the output end of the second signal transmitting means, wherein (d-2-1) the second switch includes third and fourth unit switches connected in parallel with each other between the output end of the signal processing unit and the input end of the first signal transmitting means for operating in accordance with signals which are opposite in phase to each other, (d-2-2) the third unit switch turns on and off in the control of the first control signal, and (d-2-3) the fourth unit switch turns on and off in the control of the third control signal.

Yet preferably, the control signal supplier further produces and applies a fourth control signal, which has a negative logic relation with the second control signal, to the half-latch circuits, (b-1) the first switch including first and second unit switches connected in parallel with each other to operate in accordance with signals which are opposite in phase to each other, (b-2) the first unit switch turning on and off in the control of the second control signal, and (b-3) the second unit switch turning on and off in the control of the fourth control signal.

Yet preferably, each of the first and second unit switches is substantially comprised of a complementary conductive transistor pair.

Yet preferably, the first control signal has a positive logic relation with the clock signal.

Yet preferably, each of the third and fourth unit switches is substantially comprised of a complementary conductive transistor pair.

Yet preferably, the control signal supplier further produces and applies a third control signal, which has a negative logic relation with the first control signal, to the half-latch circuits, the second signal transmitting means including (d-3) a signal processing unit having an input end connected to the input end of the second signal transmitting means and a pair of output ends either of which receives the feedback signal, and (d-4) a second switch having a pair of input ends connected to the pair of output ends of the signal processing unit and an output end for selectively outputting the feedback signal, wherein (d-4-1) the second switch includes third and fourth unit switches connected in series between the pair of input ends of the second switch for operating in accordance with signals which are opposite in phase to each other, and (d-4-2) the third and fourth unit switches are connected commonly to the output end of the second signal transmitting means, (d-4-3) the third unit switch turning on and off in the control of the first control signal, and (d-4-4) the fourth unit switch turning on and off in the control of the third control signal.

Yet preferably, the control signal supplier further produces and applies a fourth control signal, which has a negative logic relation with the second control signal, to the half-latch circuits, (b-1) the first switch including first and second unit switches connected in parallel with each other to operate in accordance with signals which are opposite in phase to each other, (b-2) the first unit switch turning on and off in the control of the second control signal, and (b-3) the second unit switch turning on and off in the control of the fourth control signal.

Yet preferably, the first control signal has a positive logic relation with the clock signal.

Yet preferably, each of the third and fourth unit switches is substantially comprised of a complementary conductive transistor pair.

Yet preferably, (d-3-1) the signal processing unit includes fifth and sixth unit switches each of which has first and second ends and a common end connected commonly to the input end of the signal processing unit for operating in accordance with signals which are opposite in phase to each other, (d-3-2) complementary potentials are applied respectively to the first ends of the fifth and sixth unit switches, and (d-3-3) the pair of output terminals of the signal processing unit are connected to the second terminal of each of the fifth and sixth unit switches.

Yet preferably, the second control signal has a negative logic relation with the clock signal.

Yet preferably, the control signal supplier includes a first inverter for receiving the second control signal to produce the fourth control signal, a second inverter for receiving the first control signal to produce the second control signal, and a third inverter for receiving the third control signal to produce the first control signal.

Yet preferably, the control signal supplier further includes a fourth inverter for receiving a clock signal to produce produce the third control signal.

Yet preferably, the control signal supplier includes a first inverter for receiving the clock signal to produce the third control signal, a second inverter for receiving the third control signal to produce the first control signal, a third inverter for receiving the clock signal to produce the second control signal, and a fourth inverter for receiving the second control signal to produce the fourth control signal.

Yet preferably, the third inverter includes first through third unit inverters connected in series.

Yet preferably, the control signal supplier includes a first inverter for receiving the clock signal to produce the third control signal, a second inverter for receiving the third control signal to produce the first control signal, a buffer for receiving the clock signal to produce the fourth control signal, and a third inverter for receiving the fourth control signal to produce the second control signal.

Yet preferably, the buffer includes first through second unit inverters connected in series.

A variation in the second control signal according to which the first switch is controlled arises after a variation of the first control signal according to which the second signal transmitting means is controlled, and therefore, an update of data is not started until the end of a period for which the second signal transmitting means is retaining data.

Even if the first switch requires the third control signal besides the second control signal, a variation of the third control signal is later than that of the second control signal, and therefore, a variation of the third control signal never arises prior to the variation of the first control signal, and an update of date is not started until the end of the period for which the second signal transmitting means is retaining data.

Also, even if the second signal transmitting means requires the fourth control signal besides the first control signal, a variation of the fourth control signal is earlier than that of the first control signal, and therefore, a variation of the second control signal never arises prior to the variation of the fourth control signal, and an update of data is not started until the end of the period for which the second signal transmitting means is retaining data.

Hence, no collision of signals arises even when data is newly input (updated), and accordingly, a demand of the semiconductor device can be reduced.

Additionally, utilizing a clocked gate for a configuration of the second signal transmitting means, a path from a power source to a ground is completely broken in the second signal transmitting means when data is newly input (updated), and accordingly, the second signal transmitting means consumes almost no electric power.

Accordingly, it is an object of the present invention to provide a semiconductor device where an extra consumption power caused by collision of signals different in logic from each other is reduced, and a demand of a feedback unit is also reduced, so that a demand of the semiconductor device is restrained to be small.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Embodiment 1

Figure 1:
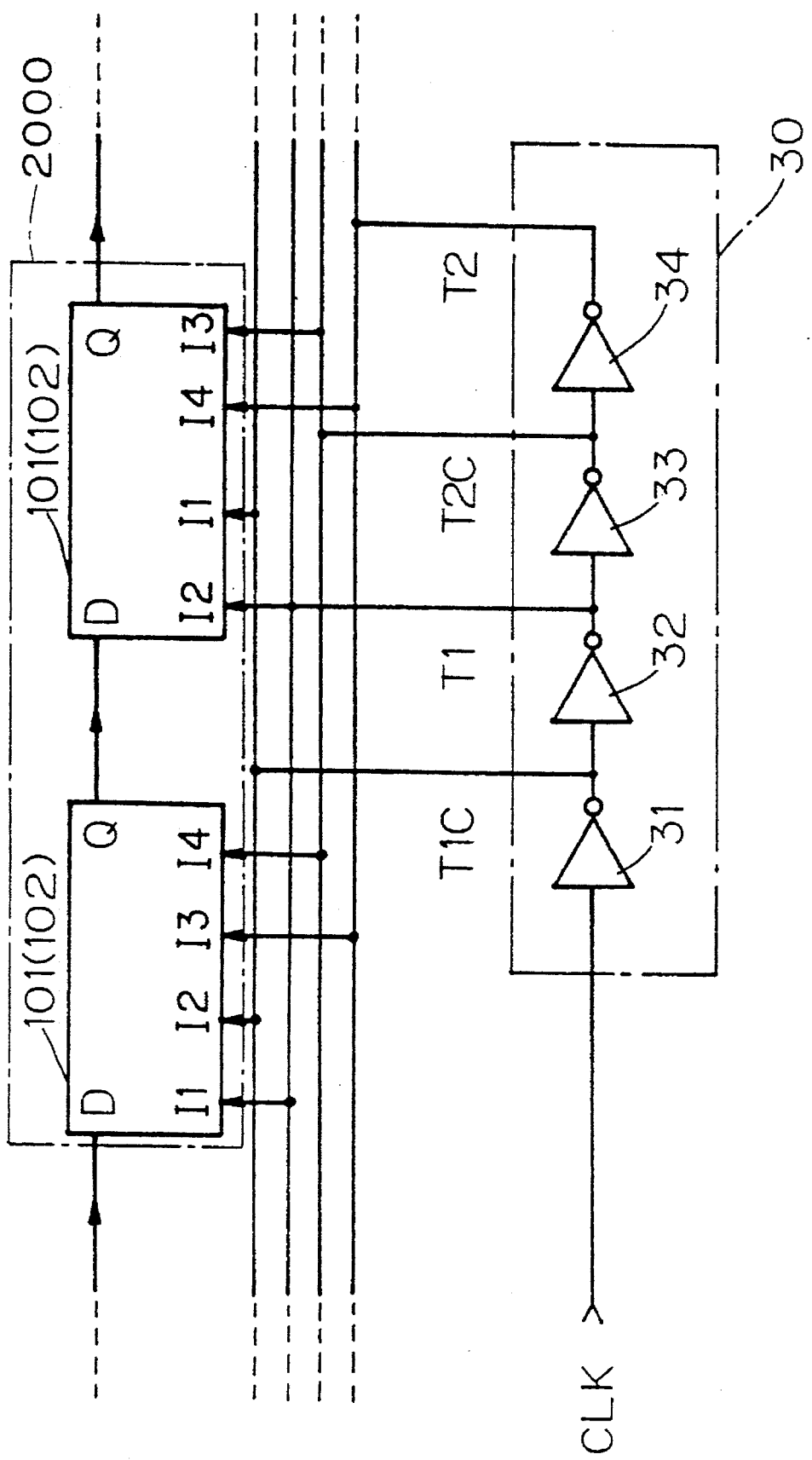
FIG. 1 is a circuit diagram showing a first preferred embodiment of the present invention.

FIG. 1 shows a circuit configuration of a shift register of a first preferred embodiment of the present invention. The shift register comprises serial connection of plural unit latches 2000. A unit latch 2000 consists of a pair of half-latches 101. The half-latch 101 disposed in left side and right side are referred to as a master and a slave, respectively. A control signal generator 30 supplies control signals T1, T1C, T2 and T2C to each of half-latches 101 connected in series. Each of half-latches 101 has control signal input ends I1, I2, I3, I4, which receive the control signals. The control signal received at the control signal input end Ik of the half-latch 101 desposed in left side is not consistent with the control signal received at the control signal input end Ik of the half-latch 101 desposed in right side for all k (K=1, 2, 3, 4). Because the unit latch 2000 is consisted of a pair of half-latches 101, i.e., a master and a slave.

The control signal generator 30 consists of four inverters 31, 32, 33 and 34 connected in series. The inverter 31 receives a clock signal CLK and inverts it to output the control signal T1C. The inverter 32 receives the control signal T1C and inverts it to output the control signal T1. The inverter 33 receives the control signal T1 and inverts it to output the control signal T2C. The inverter 34 receives the control signal T2C and inverts it to output the control signal

T2.

Thus, the control signals T1 and T2 have a positive logic relation with the clock signal CLK while the control signals T1C and T2C have a negative logic relation with the clock signal CLK. In this way, the clock signal CLK, control signals T1C, T1, T2C, and T2 are sequentially delayed in this order.

Figure 2:
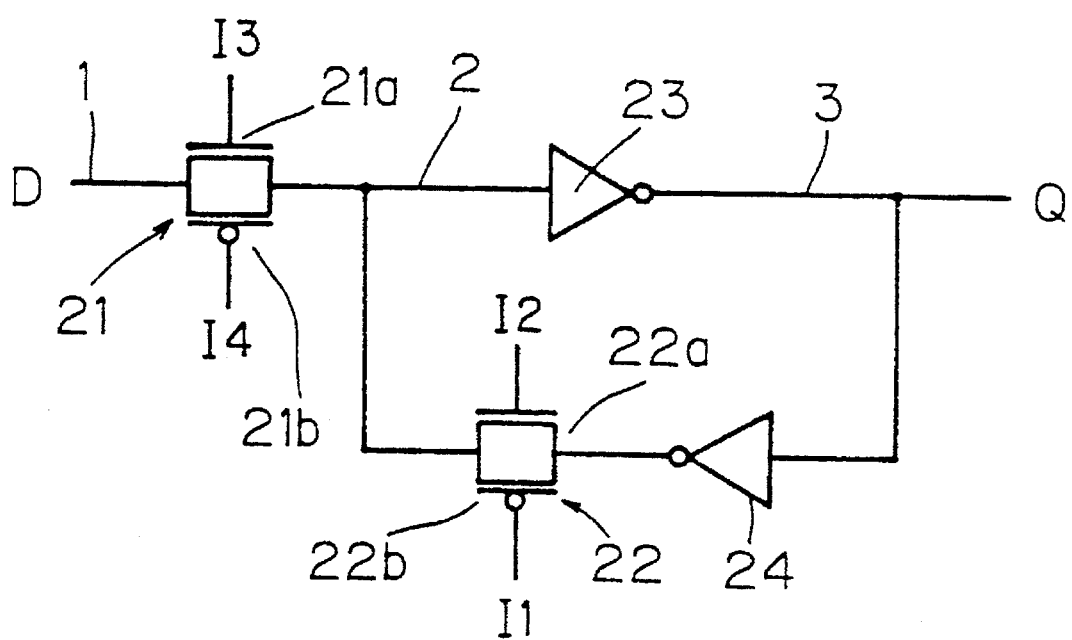
FIG. 2 is a circuit diagram showing a configuration of a latch 101.
Figure 9:
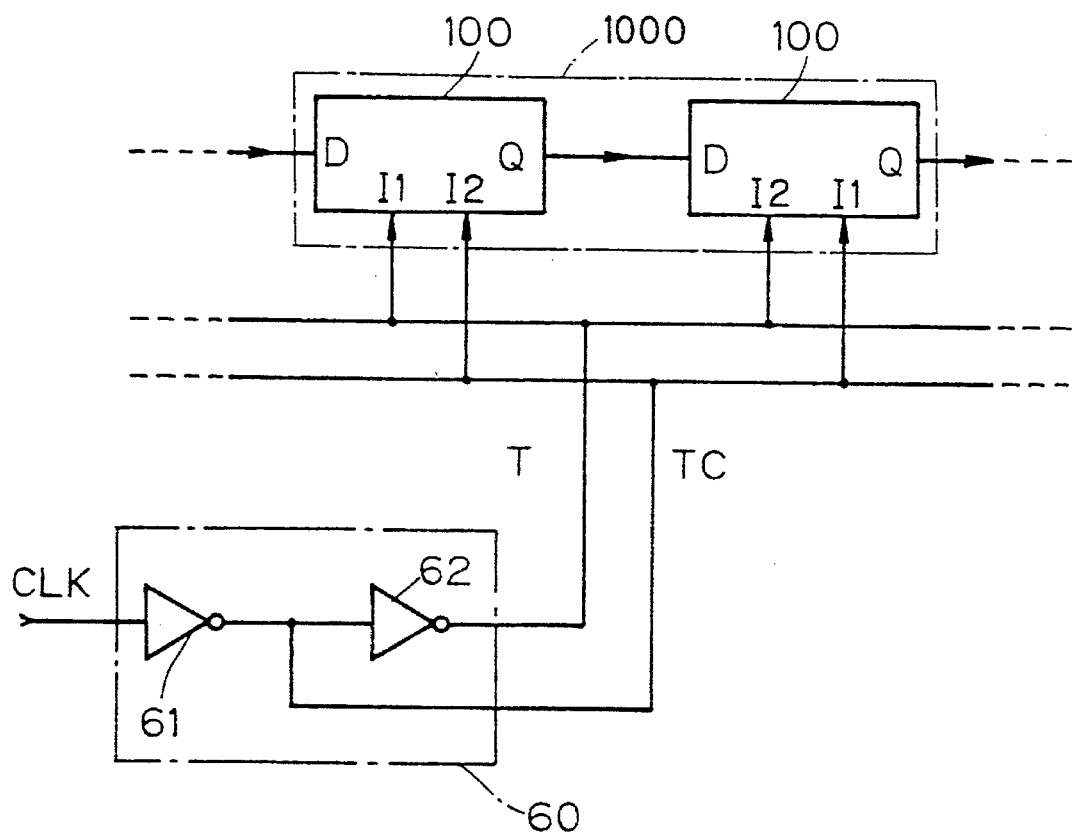
FIG. 9 is a circuit diagram for explaining a prior art technology.
Figure 10:
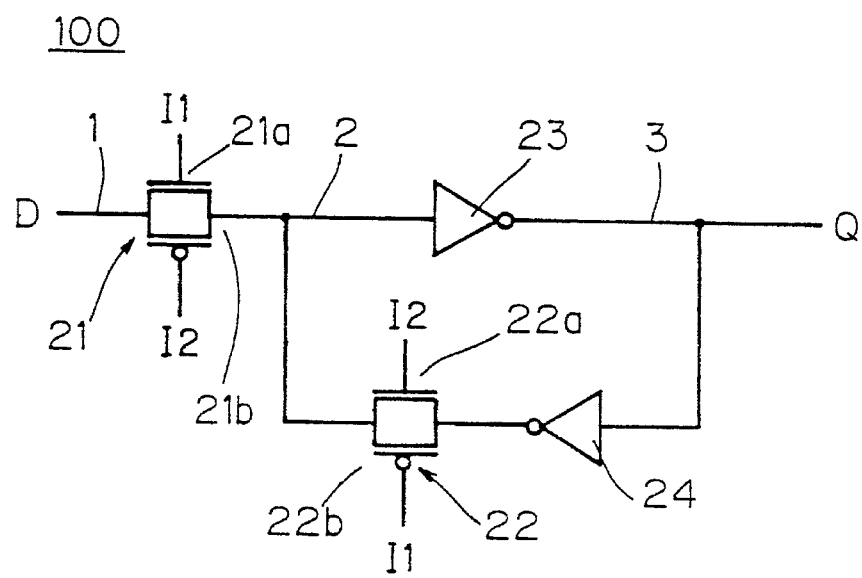
FIG. 10 is a circuit diagram for explaining a prior art technology.

FIG. 2 shows an internal configuration of one of the half-latches 101. It is identical in system design to the half-latch 100 shown in FIGS. 9 and 10 but different in control signals applied thereto.

An input line 1 leads an input signal D of the half-latch 101 to a transmission gate 21. The transmission gate 21 is connected through a signal line 2 to an inverter 23, which inverts the input signal D to apply an output signal Q to an output line 3.

On the other hand, the output line 3 is connected to an inverter 24, which inverts the output signal Q to apply the resultant signal QC through a transmission gate 22 to the inverter 23.

The transmission gate 21 consists of an N channel transistor 21a and a P channel transistor 21b, and the control signal input end I3 is connected to a gate of the transistor 21a while the control signal input end I4 is connected to a gate of the transistor 21b. Similarly, the transmission gate 22 consists of an N channel transistor 22a and a P channel transistor 22b, and the control signal input end I2 is connected to a gate of the transistor 22a while the control signal input end I1 is connected to a gate of the transistor 22b. As to the half-latch 101 disposed in left side, the control signal input ends I1, I2, I3, I4 receive control signals T1, T1C, T2, T2C, respectively.

The transmission gate 21 and the inverter 23 cooperate to receive the input signal D and produce the output signal Q, both of which function as a main unit en bloc. The transmission gate 22 and the inverter 24 cooperate to retain the output signal Q, both of which function as a feedback unit en bloc.

Figure 3:
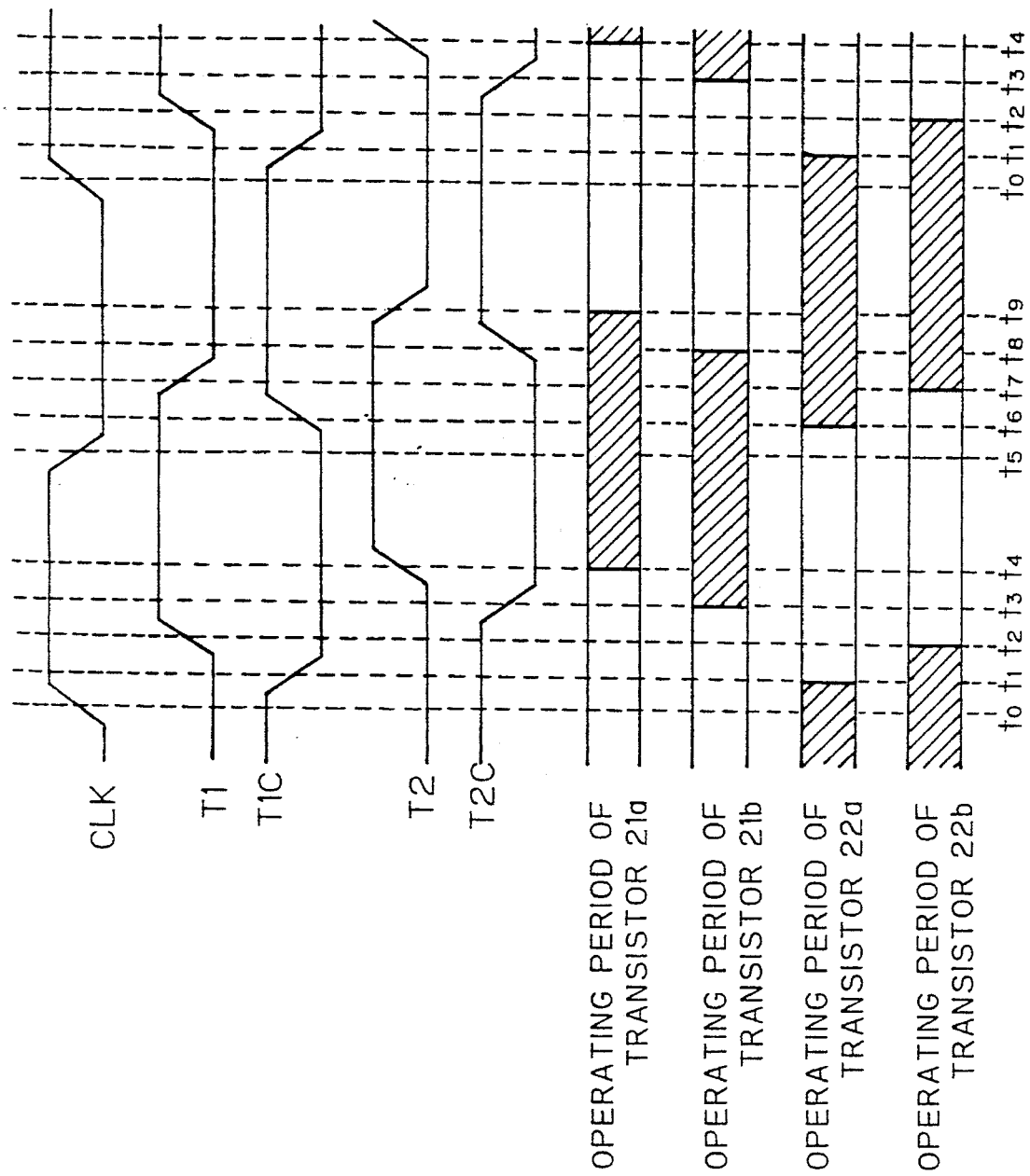
FIG. 3 is a timing chart for explaining an operation of the first preferred embodiment of the present invention.

FIG. 3 shows a timing chart for expressing a circuit operation of the half-latch 101. Hereinafter, the operation of the half-latch 101 will be described as the operation of the master. When the clock signal CLK rises at time $t_0$, the control signal T1C falls at time $t_1$. The control signal T1 rises at time $t_2$. Then, the control signal T2C falls at time $t_3$, and the control signal T2 rises at time $t_4$.

When the clock signal CLK falls at time $t_5$, the control signal T1C rises at time $t_6$. The control signal T1 rises at time $t_7$. Then, the control signal T2C rises at time $t_8$, and the control signal T2 falls at time $t_9$.

Specifically, the main unit operates in accordance with the control signals T2 and T2C which vary at late timings while the feedback unit operates in accordance with the control signals T1 and T1C which vary at early timings. Part hatched in FIG. 3 represents that each transistor is in the ON-state.

Since the control signals T2 and T2C are input respectively to the gates of the transistors 21a and 21b of which the transmission gate 21 is comprised, the transistor 21a turns on only when the control signal T2 is in the High state, while the transistor 21b turns on when the control signal T2C is in the Low state. Hence, the transmission gate 21 turns on time $t_3$ through time $t_9$ (from $t_3$, $t_4$, $t_5$, $t_6$, $t_7$ and $t_8$ till $t_9$).

Also, since the control signals T1C and T1 are input respectively to the gates of the transistors 22a and 22b of which the transmission gate 22 is comprised, the transistor 22a turns on only when the control signal T1C is in the High state, while the transistor 22b turns on when the control signal T1 is in the Low state. Hence, the transmission gate 22 turns on time $t_6$ through time $t_2$ in the succeeding cycle (from $t_6$, $t_7$, $t_8$, $t_9$, $t_0$, and $t_1$ till $t_2$).

Data input (update) operation by the main unit in the half-latch 101 is practiced time $t_3$ through time $t_9$. For the period of time, the input signal D is transmitted through the transmission gate 21 to the signal line 2. The signal transmitted to the signal line 2 is inverted by the inverter 23, and the output signal Q which has a negative logic relation with the input signal D is transmitted to the output line 3.

Data retaining operation by the feedback unit in the half-latch 101 is practiced time $t_6$ through time $t_2$. In the data retaining operation, the signal QC obtained by inverting the output signal Q in the feedback unit is applied to the signal line 2 so as to retain data in a loop made up with the inverter 23. However, time $t_6$ comes a considerably long time after about the times $t_3$ and $t4$ when the input signal D is newly received, and at that time, a logic inversion of the input signal D has been completed to settle logics of the output signal Q and the signal QC. Moreover, the input signal D has a positive logic relation with the signal QC.

Thus, even if both of the transmission gates 21 and 22 open time $t_6$ through time $t_9$, collision of the input signal D with the signal QC never arises. In other words, the transmission gate 21 never impedes a retension of data.

When the data retaining operation is completed, both of the transistors 22a and 22b are rid of the ON-state at time $t_2$. Thus, the transistors 21a and 21b which turn on respectively at times $t_3$ and $t_4$ later than time $t_2$ never let the transmission gate 21 turn on before the data retaining operation is completed.

Opening of the transmission gate 21 in the main unit at time $t_3$ causes a data input (update) operation to start.

In this embodiment, while the transmission gate 21 is turning on, the transmission gate 22 turns off. Thus, even if the logic of the input signal D is updated to cause the signal QC having a positive logic relation with the input signal not yet updated to have a negative logic relation with the updated input signal, there arises no collision of opposed signals in a transition from the data retaining operation to the data input (update) operation, and thus, no extra throughcurrent flows. Such effects can be obtained in the half-latch 101 of the slave.

Embodiment 2

Figure 4:
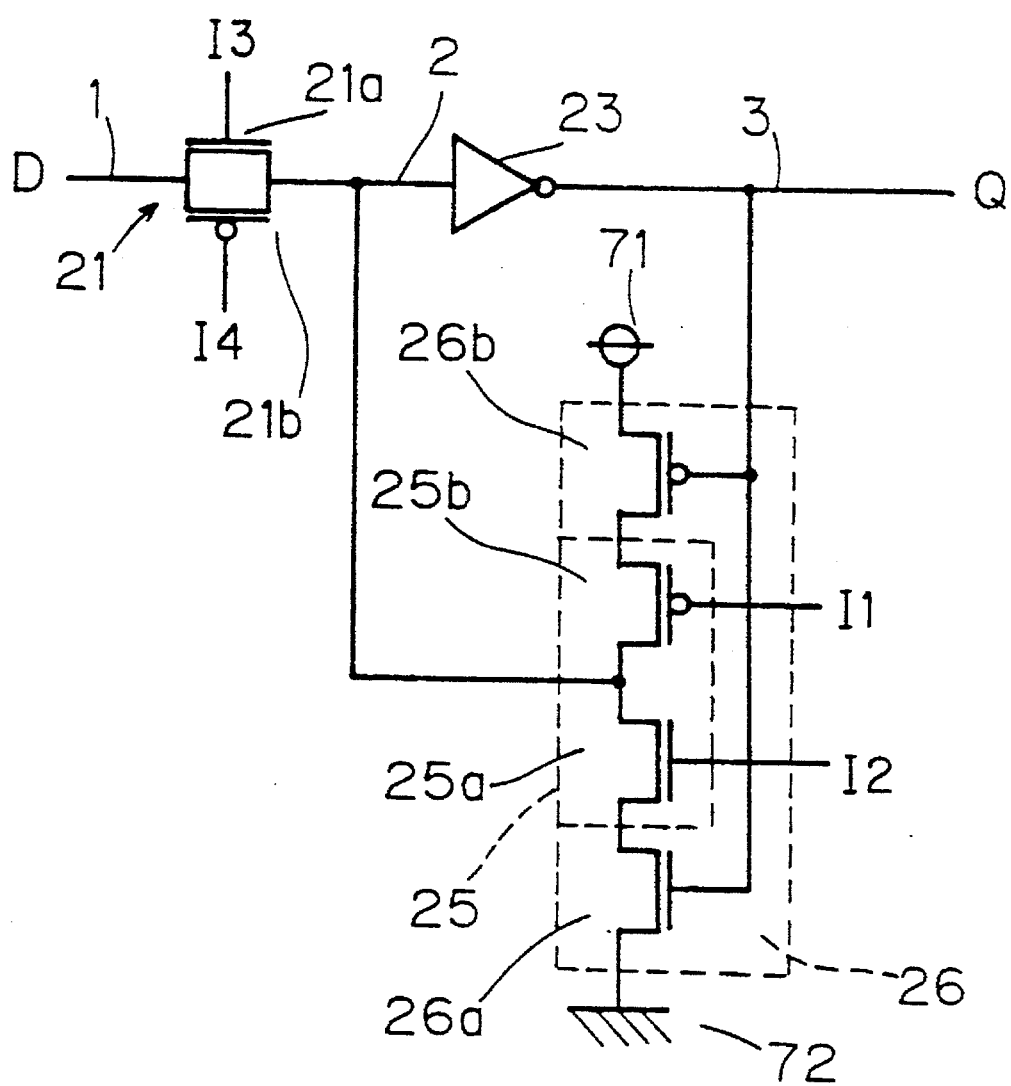
FIG. 4 is a circuit diagram showing a configuration of a half-latch 102 applied to a second preferred embodiment of the present invention.

FIG. 4 shows a configuration of a half-latch 102 used in a second preferred embodiment of the present invention. As in the first preferred embodiment, a plurality of half-latches 102 are connected in series (see FIG. 1).

A main unit consisting of a transmission gate 21, an inverter 23, an input line 1, a signal line 2, and an output line 3 is configured similar to that of the latch 101 described in the first preferred embodiment. Also similar to the half-latch 101, control signal input ends I3, I4 are connected respectively to gates of transistors 21a and 21b of which the transmission gate 21 is comprised.

On the other hand, a feedback unit is configured in a different manner from that of the half-latch 101. The output line 3 is connected to a logic inversion unit 26 having a pair of output terminals, which, in turn, is connected to a switch unit 25 having a pair of input terminals corresponding to the pair of output terminals. An output of the switch unit 25 is connected to the signal line 2.

The switch unit 25 consists of an N channel transistor 25a having a gate to which the control signal input end I2 is connected, and a P channel transistor 25b having a gate to which the control signal input end I1 is connected, both of which are connected in series. Drains of the transistors 25a and 25b are connected commonly to the signal line 2.

The logic inversion unit 26 consists of an N channel transistor 26a and a P channel transistor 26b, both of which are connected to the output line 3 so that an output signal Q is received therefrom. The transistor 26b has its source supplied with a power source 71 and its drain connected connected to a source of the transistor 25b. The transistor 26a has its source connected to a ground 72 (grounded) and its drain connected to a source of the transistor 25a. The switch unit 25 and logic inversion unit 26 configured in this way operate in accordance with clocks of the control signals T1 and T1C, and hence, they are called "clocked gate".

Figure 5:
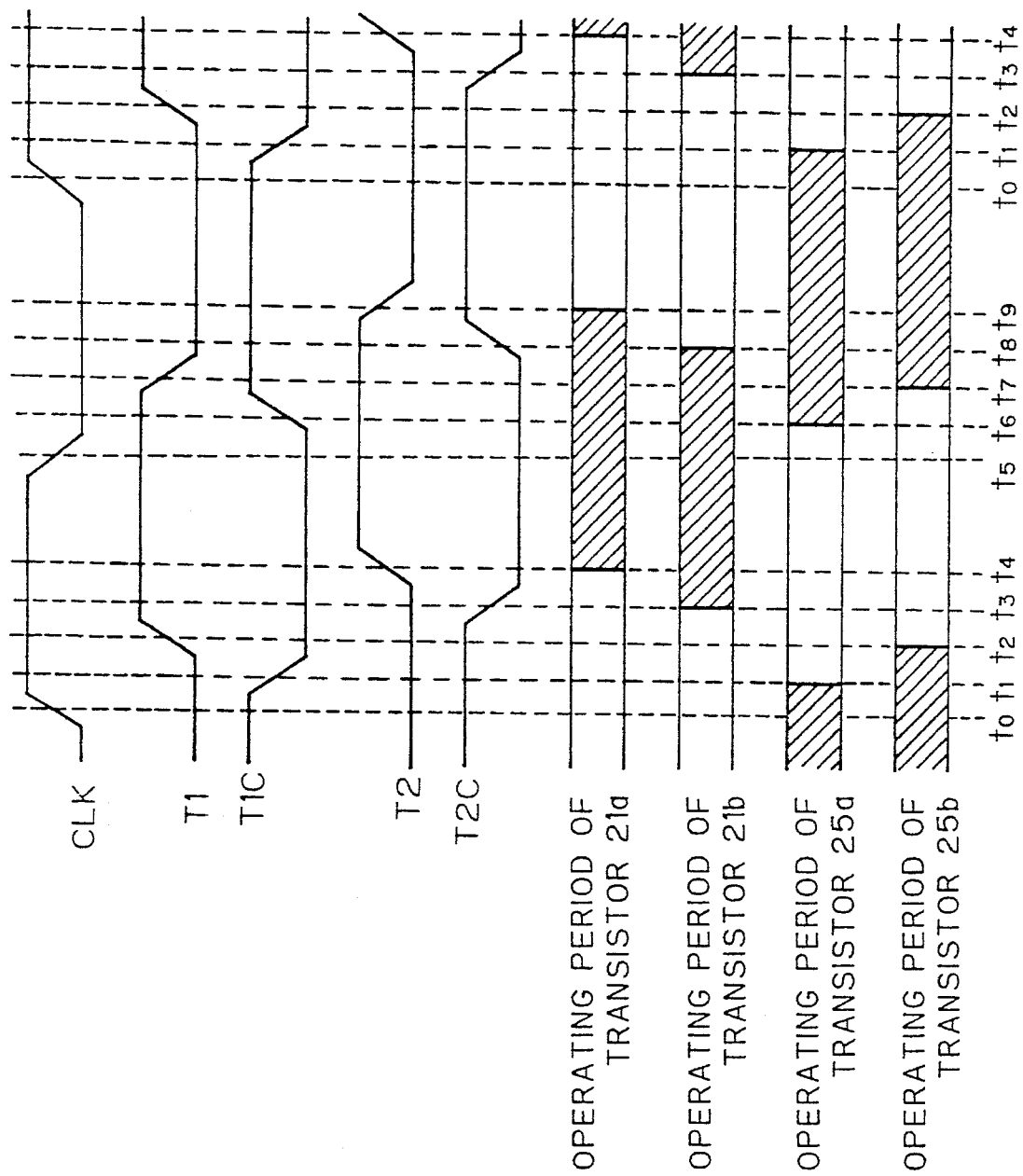
FIG. 5 is a timing chart for explaining an operation of the second preferred embodiment of the present invention.

FIG. 5 shows a timing chart for illustrating a circuit operation of the half-latch 102. Varying timings of the control signals T1, T1C, T2 and T2C to the half-latch 102 are the same as in FIG. 3. In the second preferred embodiment, the operation of the half-latch 102 is described as the operation of the master. The control signal input ends I1, I2, I3, I4 of the master receive control signals T1, T1C, T2, T2C, respectively.

In FIG. 5, also, hatched part indicate a period when each transistor in the half-latch 102 turns on. The transistor 21a turns on time $t_4$ through time $t_9$ (from time $t_4$, $t_5$, $t_6$, $t_7$, and $t_8$ till time $t_9$), the transistor 21b turns on time $t_3$ through time $t_8$ (from time $t_3$, $t_4$, $t_5$, $t_6$, and $t_7$ till time $t_8$), the transistor 25a turns on time $t_6$ through time $t_1$ in the succeeding cycle (from time $t_6$, $t_7$, $t_8$, $t_9$, and $t_0$ till time $t_1$), and the transistor 25b turns on time $t_7$ through time $t_2$ in the succeeding cycle (from time $t_7$, $t_8$, $t_9$, $t_0$, and $t_1$ till time $t_2$). In this way, the main unit in the half-latch 102 operates in accordance with the clock signals T2 and T2C which vary at late timings while the feedback unit in the half-latch 102 operates in accordance with the clock signals T1 and T1C which vary at early timings.

Data input operation by the main unit in the half-latch 102 is similar to that of the half-latch 101 described in the first preferred embodiment. Data retaining operation by the feedback unit will be explained below.

When either the transistor 25a or the transistor 25b turns on in the switch unit 25, the output signal Q is inverted by the logic inversion unit 26, and sometimes the signal QC which has a negative logic relation with the output signal Q is applied to a drain of either of the transistors. Accordingly, sometimes the signal QC is applied to the signal line 2. However, either of the transistors 25a and 25b turns on only time $t_6$ through time $t_2$, and since a considerably long time has elapsed since the times $t_3$ and $t_4$ when the data input (update) operation is started, operation of the inverter 23 is completed to settle a logic of the output signal Q. Thus, collision of signals different in logic from each other never arises in the signal line 2 in a transition from the data input operation to the data retaining operation, and the output signal Q and the signal QC can be retained in safety respectively in the output line 3 and the signal line 2.

Moreover, in a transition from the data retaining operation to the data input (update) operation, the transistors 21a, 21b, 25a and 25b turn off from time $t_2$ till time $t_3$, and therefore, signals different in logic from each other never collide with each other in the signal line 2. Thus, almost no through-current flows in any transition of operations.

In the transition from the data retaining operation to the data input (update) operation, both the transistors 25a and 25b turn off in the switch unit 25 when the transmission gate 21 turns on, and hence, the transistors 26a and 26b of which the logic inversion unit 26 is comprised do not have their respective drains connected to each other. This means a path leading from the power source 71 to the ground 72 is broken, and almost no through-current flows at this time. Thus, the feedback unit consisting of the switch unit 25 and the logic inversion unit 26 consumes almost no electric power in updating the input signal Q. Such effects can be obtained in the half-latch 102 of the slave.

Embodiment 3

The control signal generator 30 shown in FIG. 1 is not the only configuration whereby the control signals T1, T1C, T2 and T2C can be produced based upon the clock signal CLK.

Figure 6:
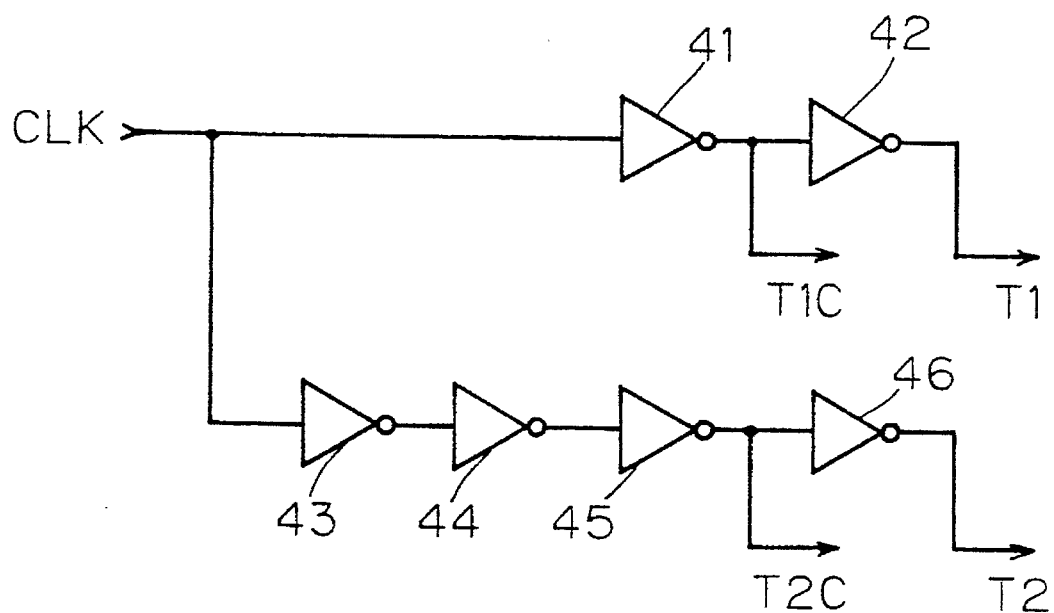
FIG. 6 is a circuit diagram showing a configuration of a control signal generator 40 applied to a third preferred embodiment of the present invention.

FIG. 6 is a circuit diagram showing a configuration of a control signal generator 40. The control signal generator 40 can be applied either the half-latch 101 or the half-latch 102 in the previously mentioned embodiments.

Inverters 41 and 42 are connected in series; the inverter 41 receives a clock signal CLK to produce a control signal T1C while the inverter 42 receives the control signal T1C to produce a control signal T1.

Inverters 43, 44 and 45 are connected in series; the clock signal CLK input to the inverter 43 is inverted three times, and a control signal T2C is output from the inverter 45. However, the control signal T2C, which is obtained through the third logic inversion, varies at a timing later than the control signal T1 which is obtained through the second logic inversion.

Additionally, a control signal T2 is produced by an inverter 46 connected in series with the inverters 43, 44 and 45. Thus, the clock signal CLK, control signals T1C, T1, T2C and T2 are delayed in this order. Also, the control signals T1 and T2 have a positive logic relation with the clock signal CLK while the control signals T1C and T2C have a negative logic relation with the clock signal CLK.

Thus, even with the control signal generator 40, the half-latches 101 and 102 operate in accordance with a timing similar to those explained in the first and second preferred embodiments, and the same effects can be attained.

Embodiment 4

Another configuration may be applied to produce the control signals T1, T1C, T2 and T2C based upon the clock signal CLK.

Figure 7:
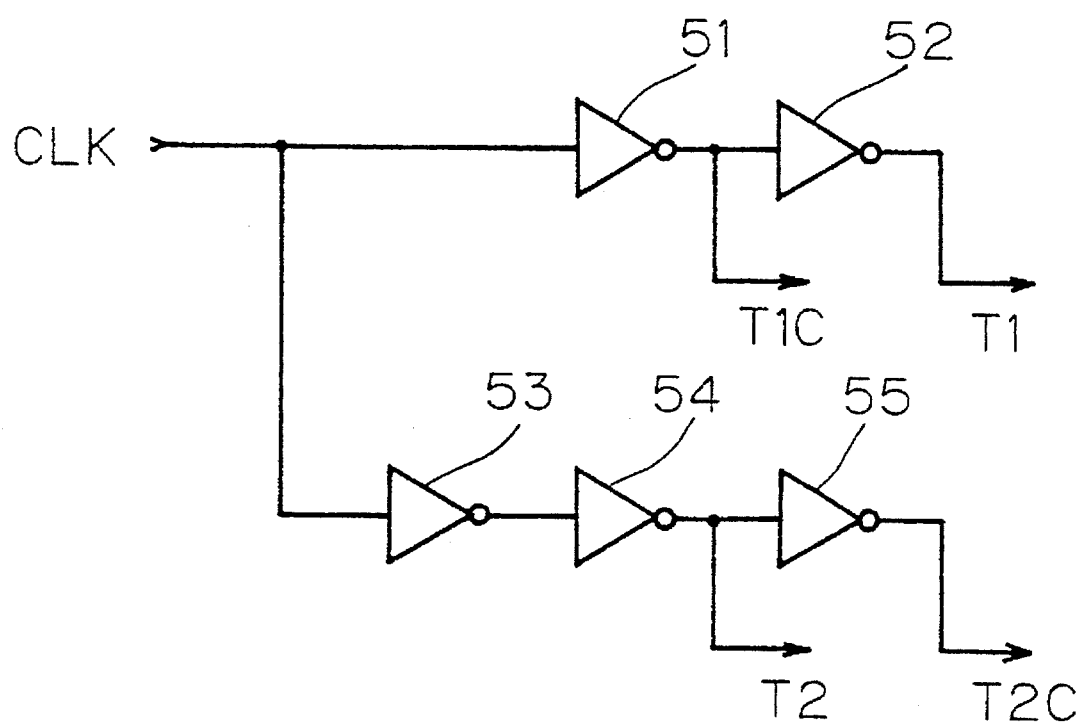
FIG. 7 is a circuit diagram showing a configuration of a control signal generator 50 applied to a fourth preferred embodiment of the present invention.

FIG. 7 is a circuit diagram showing a configuration of a control signal generator 50. The control signal generator 50 can be applied to either of the half-latches 101 and 102 in the previously mentioned embodiments.

Inverters 51 and 52 are connected in series; the inverter 51 receives a clock signal CLK to produce a control signal T1C while the inverter 52 receives the control signal T1C to produce a control signal T1. Thus, the control signals T1 and T1C are produced the same as in the third preferred embodiment.

Inverters 53, 54 and 55 are connected in series. The clock signal CLK input to the inverter 53 is inverted twice, and consequently, a control signal T2 is output from the inverter 54. The control signal T2 is applied to the inverter 55, and consequently, a control signal T2C is output therefrom. Similar to the control signal generators 30, 40 and 50 described in the first through third preferred embodiments, the control signals T1 and T2 have a positive logic relation with the clock signal CLK while the control signals T1C and T2C have a negative logic relation with the clock signal CLK.

In the fourth preferred embodiment, however, the clock signal CLK, control signals T1C, T1 and T2C are delayed in this order though the control signal T2 is successively produced at the same timing with the control signal T1. Thus, when the control signal generator 50 applies the control signals T1, T1C, T2 and T2C to the half-latch 101 or the half-latch 102, it is possible for through-current to flow.

Figure 8:
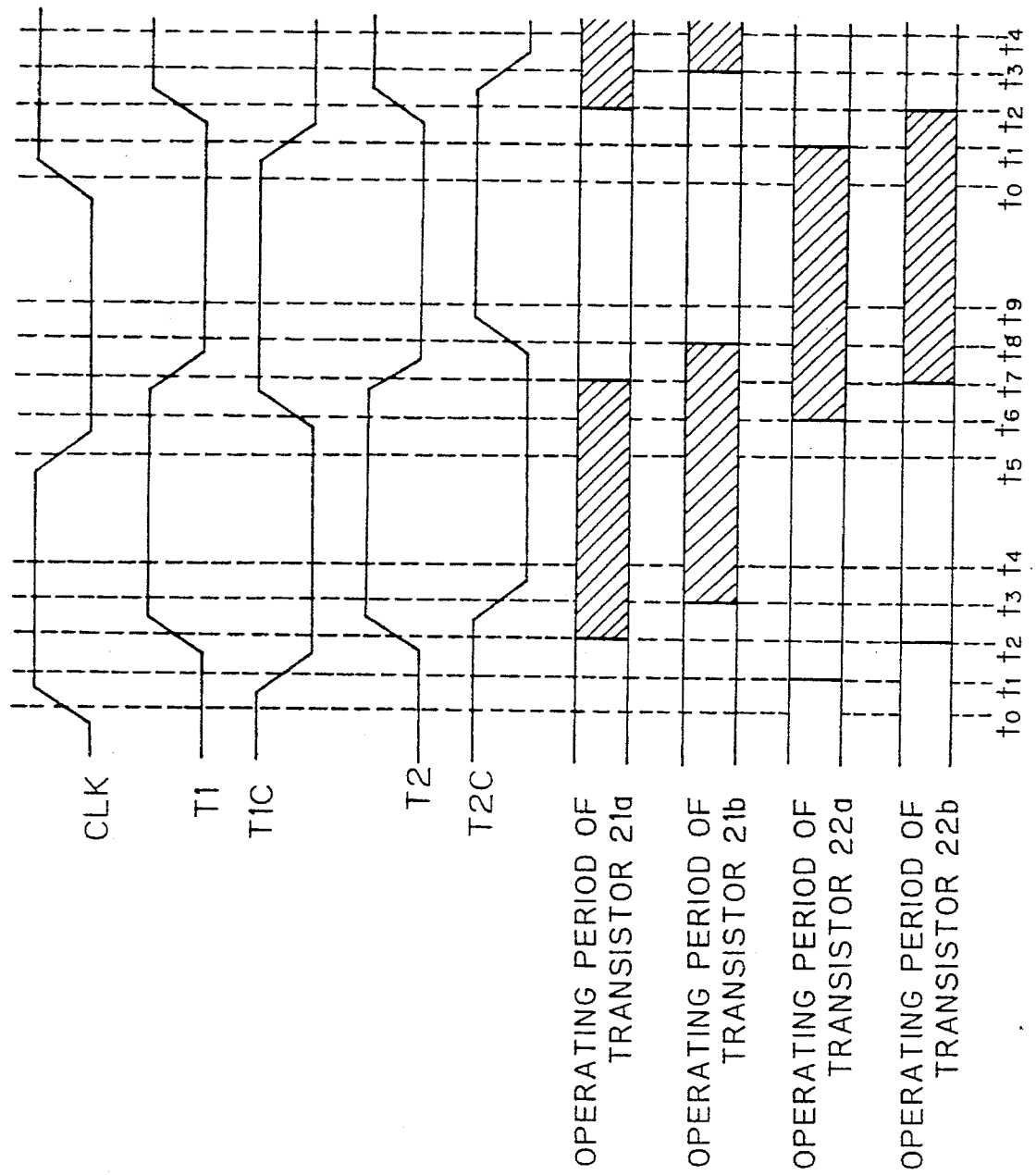
FIG. 8 is a timing chart for explaining an operation of the fourth preferred embodiment.

For explaining this in detail, FIG. 8 illustrates a timing chart in the case where the control signal generator 50 applies the control signals T1, T1C, T2 and T2C to the half-latch 101. The transistor 21a turns on or off in accordance with the control signal T2, and as can be seen, it turns on at time $t_2$. The transmission gate 22 for retaining data is in the ON-state till time $t_2$. Then, sometimes signals different in logic from each other instantaneously collide with each other in the signal line 2 at time $t_2$.

Figure 11:
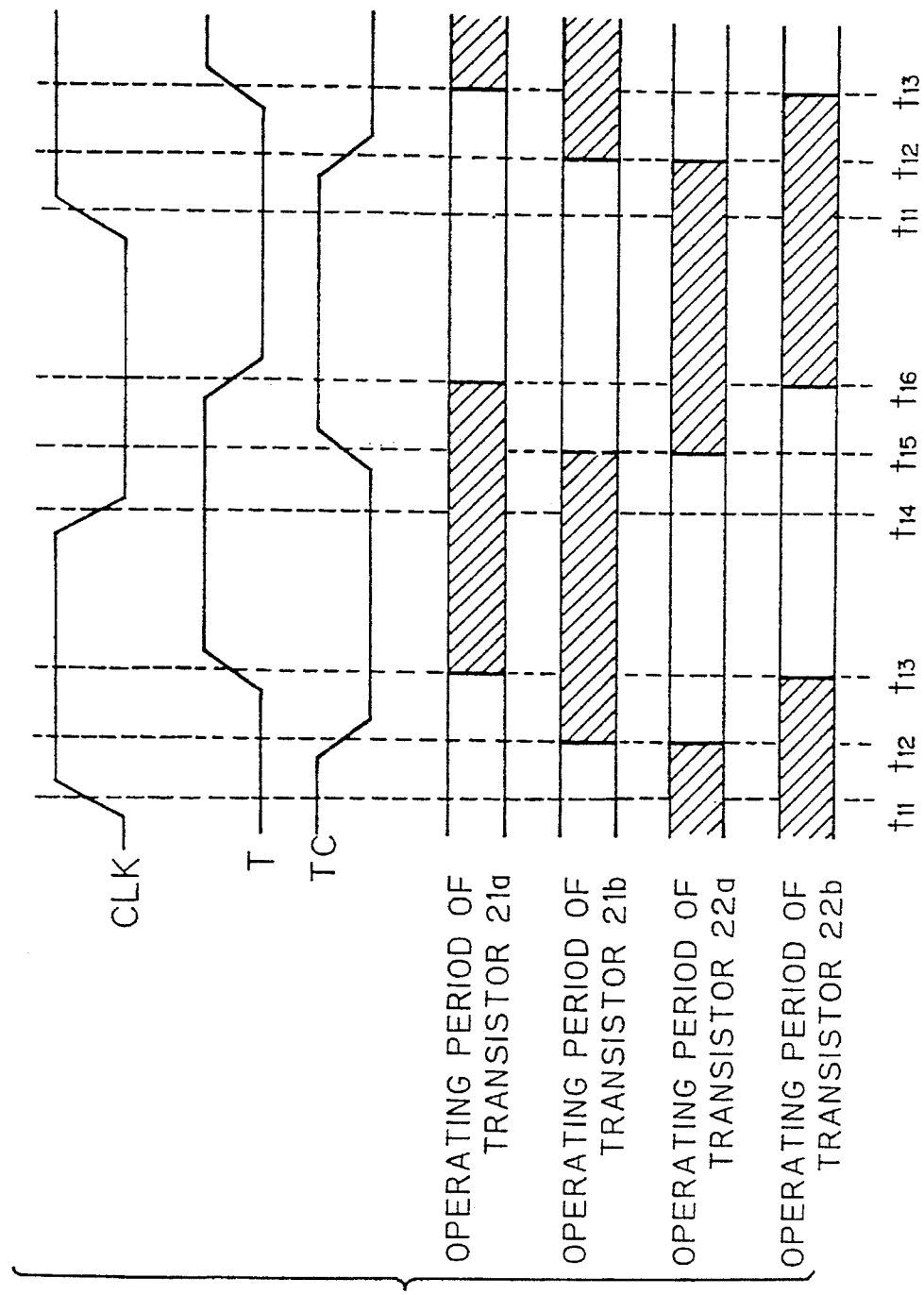
FIG. 11 is a circuit diagram for explaining a prior art technology.

However, collision of the signals arises in an instant, and even if through-current flows, a period for current flowing is very short compared with a case in the prior art mode as illustrated time $t_{12}$ through time $t_{13}$ in FIG. 11. Thus, also in the fourth preferred embodiment, power consumption due to the through-current is very small, and it is apparent that a demand is effectively reduced.

Also in the case where the control signal generator 50 applies the control signals T1, T1C, T2 and T2C to the half-latch 102, a demand of the feedback unit can be further reduced similar to the second preferred embodiment.

As has been described, according to the present invention, a first switch of a unit latch circuit operates at a timing later than a second signal transmitting means, and hence, collision of signals different in logic from each other can be avoided in updating a signal applied to an input terminal. Thus, since no extra through-current caused by the collision of the signals flows, a demand of a semiconductor device can be reduced.

In addition to that, if a clocked gate is used for a configuration of the second signal transmitting means, the second signal transmitting means consumes almost no power in updating the signal applied to the input terminal, and therefore, the demand of the semiconductor device can further be reduced.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:

a unit latch circuit consisting of a pair of half-latch circuits, and a control signal supplier processing a clock signal after first and second processing periods of time to produce and apply respective first and second control signals substantially identical in pulse width with the clock signal for applying the first and second control signals to each of said unit latch circuits; wherein said second processing period of time is equal to or longer than and said first processing period of time;

each of said pair of half-latch circuits including (a) an input terminal and an output terminal, (b) a first switch connected to said input terminal for turning on or off in the control of said second control signal, (c) first signal transmitting means having an input end connected through said first switch to said input terminal and an output end connected to said output terminal, for practicing a logic inversion, and (d) second signal transmitting means having an input end connected to an output end of said first signal transmitting means and an output end connected to an input end of said first signal transmitting means, for, in accordance with said first control signal, outputting a feedback signal which is obtained by practicing a logic inversion to an output from said first signal transmitting means, wherein said control signal supplier further produces and applies a third control signal, which has a negative logic relation with said first control signal, to said half-latch circuits;

said second signal transmitting means including (d-3) a signal processing unit having an input end connected to said input end of said second signal transmitting means and a pair of output ends either of which receives said feedback signal, and (d-4) a second switch having a pair of input ends connected to said pair of output ends of said signal processing unit and an output end for selectively outputting said feedback signal; wherein (d-4-1) said second switch includes first and second unit switches connected in series between said pair of input ends of said second switch for operating in accordance with signals which are opposite in phase to each other, (d-4-2) said first and second unit switches are connected commonly to said output end of said second signal transmitting means, (d-4-3) said first unit switch turning on and off in the control of said first control signal, and (d-4-4) said second unit switch turning on and off in the control of said third control signal; and wherein said control signal supplier further produces and applies a fourth control signal, which has a negative logic relation with said second control signal, to said half-latch circuits;

(b-1) said first switch including third and fourth unit switches connected in parallel with each other to operate in accordance with signals which are opposite in phase to each other, (b-2) said third unit switch turning on and off in the control of said second control signal, and (b-3) said fourth unit switch turning on and off in the control of said fourth signal.

2. A device according to claim 1, wherein said first control signal has a positive logic relation with said clock signal.

3. A device according to claim 1, wherein each of said third and fourth unit switches is substantially comprised of a complementary conductive transistor pair.

4. A device according to claim 2, wherein (d-3-1) said signal processing unit includes fifth and sixth unit switches each of which has first and second ends and a common end connected commonly to said input end of said signal processing unit for operating in accordance with signals which are opposite in phase to each other, (d-3-2) complementary potentials are applied respectively to said first ends of said fifth and sixth unit switches, and (d-3-3) said pair of output terminals of said signal processing unit are connected to said second terminal of each of said fifth and sixth unit switches.

5. A device according to claim 2, wherein said second control signal has a negative logic relation with said clock signal.

6. A device according to claim 5, wherein said control signal supplier includes a first inverter for receiving said second control signal to produce said fourth control signal, a second inverter for receiving said first control signal to produce said second control signal, and a third inverter for receiving said third control signal to produce said first control signal.

7. A device according to claim 6, wherein said control signal supplier further includes a fourth inverter for receiving a clock signal to produce said third control signal.

8. A device according to claim 5, wherein said control signal supplier includes a first inverter for receiving said clock signal to produce said third control signal, a second inverter for receiving said third control signal to produce said first control signal, a third inverter for receiving said clock signal to produce said second control signal, and a fourth inverter for receiving said second control signal to produce said fourth control signal.

9. A device according to claim 8, wherein said third inverter includes first through third unit inverters connected in series.

10. A device according to claim 5, wherein said control signal supplier includes a first inverter for receiving said clock signal to produce said third control signal, a second inverter for receiving said third control signal to produce said first control signal, a buffer for receiving said clock signal to produce said fourth control signal, and a third inverter for receiving said fourth control signal to produce said second control signal.

11. A device according to claim 10, wherein said buffer includes first through second unit inverters connected in series.

12. A device according to claim 1, wherein each of said first and second unit switches is substantially comprised of a complementary transistor pair.

* * * * *